(12) United States Patent
Guo et al.

(10) Patent No.: US 7,675,361 B2
(45) Date of Patent: Mar. 9, 2010

(54) CLASS-D AMPLIFIER AND MULTI-LEVEL OUTPUT SIGNAL GENERATED METHOD THEREOF

(75) Inventors: Lee-Chun Guo, Tainan (TW); Ming-Hsun Sung, Hsinchu (TW)

(73) Assignee: ITE Tech. Inc., Hsinchu (TW)

( * ) Notice: Subject to any disclaimer, the term of this patent is extended or adjusted under 35 U.S.C. 154(b) by 69 days.

(21) Appl. No.: 12/025,055

(22) Filed: Feb. 4, 2008

(65) Prior Publication Data

US 2009/0146737 A1    Jun. 11, 2009

(30) Foreign Application Priority Data

Dec. 5, 2007    (TW)    ............... 96146347 A

(51) Int. Cl.
*H03F 3/217*    (2006.01)

(52) U.S. Cl. .................. 330/251; 330/297; 330/285

(58) Field of Classification Search .......... 330/251, 330/297, 285
See application file for complete search history.

(56) References Cited

U.S. PATENT DOCUMENTS

| | | | |
|---|---|---|---|
| 5,077,539 A * | 12/1991 | Howatt | 330/10 |
| 5,898,340 A | 4/1999 | Chatterjee et al. | |
| 6,175,272 B1 | 1/2001 | Takita | |
| 6,606,483 B1 * | 8/2003 | Baker et al. | 455/126 |
| 6,665,525 B2 * | 12/2003 | Dent et al. | 455/108 |
| 7,116,946 B2 * | 10/2006 | Tanabe et al. | 455/91 |
| 7,221,216 B2 * | 5/2007 | Nguyen | 330/10 |
| 7,276,976 B2 * | 10/2007 | Oh et al. | 330/311 |

* cited by examiner

*Primary Examiner*—Patricia Nguyen
(74) *Attorney, Agent, or Firm*—Jianq Chyun IP Office

(57) ABSTRACT

A class-D amplifier and a method of generating a multi-level output signal thereof are provided. The class-D amplifier includes a controlling logic circuit and an output module. The controlling logic circuit analyzes the amplitude of an input signal to generate a voltage modifying signal. A power supply provides a voltage according to the voltage modifying signal. The controlling logic circuit generates controlling signals according to the input signal. The output module generates an output signal to drive a load according to the voltage and the controlling signals. In other words, the resolution of the amplitude of the output signal is increased by modifying the voltage, and a signal to noise ratio is then increased.

15 Claims, 9 Drawing Sheets

CLASS-D AMPLIFIER AND MULTI-LEVEL OUTPUT SIGNAL GENERATED METHOD THEREOF

CROSS-REFERENCE TO RELATED APPLICATION

This application claims the priority benefit of Taiwan application serial no. 96146347, filed on Dec. 5, 2007. The entirety of the above-mentioned patent application is hereby incorporated by reference herein and made a part of this specification.

BACKGROUND OF THE INVENTION

1. Field of the Invention

The present invention relates to a class-D amplifier, and more particular relates to a technique for improving the resolution of an output signal.

2. Description of Related Art

With progressive development toward processing digital audio signals, more and more signal sources have been digitized, and thus class-D amplifiers featuring full digital processing are gradually prevailing.

FIG. 1 is a schematic view illustrating a conventional half-bridge class-D amplifier. Referring to FIG. 1, a class-D amplifier 10 includes a controlling logic circuit 20 and an output module 30. The class-D amplifier 10 modulates an input signal $S_{in+}$ to a pulse width modulation (PWM) signal PWM1 through employing a switching technology of the output module 30. Conventionally, a power supply 40 is only capable of providing a constant voltage VDD. The output module 30 is coupled to the constant voltage VDD and a ground terminal GND. Switches 101 and 102 generate the two-level PWM signal PWM1 while the switches 101 and 102 are completely turned on or turned off.

Next, an additionally disposed low-pass filter 50 is utilized for filtering out high-band noises caused by the PWM signal PWM1 when the output module 30 is switched on or off. Finally, a direct current (DC) filter capacitor 60 is employed to remove unwanted DC noises of the PWM signal PWM1, so as to drive a speaker 110.

FIG. 2 is a schematic view illustrating a waveform of a PWM signal generated by the class-D amplifier depicted in FIG. 1. Referring to FIGS. 1 and 2, the input signal $S_{in+}$ is assumed to have a signed 2's complement value. A triangular waveform 120 is provided by a controlling logic circuit 20 and is represented by the signed 2's complement value as well. The controlling logic circuit 20 is able to compare the input signal $S_{in+}$ with the triangular waveform 120, and thereby controlling signals $S_{C1}$ and $S_{C2}$ are generated. The controlling signals $S_{C1}$ and $S_{C2}$ determine whether the switches 101 and 102 are turned on, so as to generate the PWM signal PWM1.

In particular, as the amplitude of the input signal $S_{in+}$ is greater than the amplitude of the triangular waveform 120, the PWM signal PWM1 reaches a high voltage level, i.e. the voltage VDD. By contrast, as the amplitude of the input signal $S_{in+}$ is less than the amplitude of the triangular waveform 120, a low voltage level, i.e. the voltage GND, is provided to the PWM signal PWM1.

Note that a reference clock is required for generating all kinds of signals. In other words, resolution 130 represented by the PWM signal PWM1 depicted in FIG. 1 is restricted by frequencies of the clock of the class-D amplifier 10. Hence, certain quantization errors are generated by the PWM signal PWM1, further posing an impact on a signal to noise ratio (SNR) or a dynamic range (DR) of the class-D amplifier 10.

To increase the resolution of the PWM signal, a full-bridge class-D amplifier for increasing level variations of the PWM signal is proposed by the pertinent art. FIG. 3 is a schematic view illustrating a conventional full-bridge class-D amplifier. FIG. 4 is a schematic view illustrating a waveform of the PWM signal generated by the class-D amplifier depicted in FIG. 3. Referring to FIGS. 3 and 4, an output module 31 of a full-bridge class-D amplifier 11 includes not only the switches 101 and 102 but also switches 103 and 104. The class-D amplifier 11 is not only able to generate the PWM signal PWM1 in the manner indicated hereinbefore, but also capable of generating another PWM signal PWM2 with use of a controlling logic circuit 21 and the switches 103 and 104, which is elaborated below.

A 180-degree phase shifting of the input signal $S_{in+}$ is first performed by the controlling logic circuit 21 for generating the input signal $S_{in-}$. Next, the input signal $S_{in-}$ is compared with the triangular waveform 120, such that controlling signals $S_{C3}$ and $S_{C4}$ are generated for determining whether the switches 103 and 104 are turned on or not. Thereby, the PWM signal PWM2 is generated.

In particular, as the amplitude of the input signal $S_{in-}$ is greater than the amplitude of the triangular waveform 120, the PWM signal PWM2 reaches the high voltage level, i.e. the voltage VDD. By contrast, as the amplitude of the input signal $S_{in-}$ is less than the amplitude of the triangular waveform 120, the PWM signal PWM2 is set to the low voltage level, i.e. the voltage GND.

The PWM signals PWM1 and PWM2 respectively connect two ends of the speaker. Thus, a signal received by the speaker 110 can be considered as a PWM signal PWM3 calculated by subtracting the PWM signals PWM1 and PWM2, whereby the PWM signal PWM3 generated by the class-D amplifier 11 is provided with three levels, i.e. the voltages VDD, 0, and −VDD. As such, the relatively great SNR can be achieved by the class-D amplifier 11.

SUMMARY OF THE INVENTION

The present invention is directed to a class-D amplifier for raising an SNR.

The present invention is further directed to a method of generating a multi-level output signal. The method is adapted to a class-D amplifier and enables the output signal to have various level variations, thereby increasing the resolution of the output signal.

The present invention provides a class-D amplifier coupled to a power supply. The class-D amplifier includes a controlling logic circuit and an output module. The controlling logic circuit is coupled to the power supply and is used to generate a voltage modifying signal by analyzing the amplitude of a first input signal. The controlling logic circuit generates a plurality of controlling signals according to the first input signal. The power supply provides a first voltage according to the voltage modifying signal. The output module is coupled to the controlling logic circuit and the power supply. As such, according to the controlling signals and the first voltage, the output module generates an output signal to drive a load.

According to an embodiment of the present invention, the controlling logic circuit includes an amplitude detector, a waveform generator, a comparator, and a non-overlapping unit. The amplitude detector analyzes the amplitude of the first input signal. The waveform generator coupled to the amplitude detector provides a reference waveform based on the amplitude of the first input signal. The comparator coupled to the amplitude detector and the waveform generator provides a first comparison signal by comparing the first input signal with the reference waveform. The non-overlapping unit coupled to the comparator generates a first controlling signal and a second controlling signal of the controlling signals based on the first comparison signal. According to another embodiment of the present invention, the reference waveform is a triangular waveform.

According to an embodiment of the present invention, the controlling logic circuit further includes an inverter, a second comparator, and a second non-overlapping unit. The inverter generates a second input signal based on the first input signal. Here, the first input signal and the second input signal are inverted. The second comparator coupled to the inverter and the waveform generator provides a second comparison signal by comparing the second input signal with a second reference waveform provided by the waveform generator. The second non-overlapping unit coupled to the second comparator generates a third controlling signal and a fourth controlling signal of the controlling signals based on the second comparison signal.

According to an embodiment of the present invention, the output module includes a first transistor and a second transistor. A first end of the first transistor and a gate terminal of the first transistor respectively receive the first voltage and the first controlling signal. A first end of the second transistor is coupled to a second end of the first transistor, and a second end of the second transistor and a gate terminal of the second transistor respectively receive the second voltage and the second controlling signal. According to another embodiment of the present invention, the output module further includes a third transistor and a fourth transistor. A first end of the third transistor and a gate terminal of the third transistor respectively receive the first voltage and a third controlling signal. A first end of the fourth transistor is coupled to a second end of the third transistor, and a second end of the fourth transistor and a gate terminal of the fourth transistor respectively receive the second voltage and a fourth controlling signal.

According to an embodiment of the present invention, the class-D amplifier further includes a filter circuit. The filter circuit is coupled to the output module for filtering out noises of the output signal. According to another embodiment of the present invention, the filter circuit includes a filter and a DC filter capacitor. The filter is coupled to the output module for filtering out high-band noises of the output signal. The DC filter capacitor is coupled to the filter for filtering out DC noises of the output signals.

According to still another embodiment of the present invention, the second voltage is provided by the power supply based on the amplitude of the input signal. According to yet still another embodiment of the present invention, the load is a speaker, an earphone, or an audio signal output apparatus.

From another perspective, the present invention provides a method of generating a multi-level output signal. The method is adapted to a class-D amplifier and includes analyzing the amplitude of the input signal for generating a voltage modifying signal. In addition, a plurality of controlling signals is generated based on the input signal. Moreover, a voltage is provided to the class-D amplifier based on the voltage modifying signal. Furthermore, an output signal is generated based on the controlling signals and the voltage, wherein the level of the output signal varies upon the voltage.

According to an embodiment of the present invention, the step of generating a plurality of the controlling signals based on the input signal includes providing a reference waveform based on the amplitude of the input signal. After that, the input signal is compared with the reference waveform for providing a comparison signal. Thereafter, the controlling signals are generated based on the comparison signal. According to another embodiment of the present invention, the method of generating the multi-level output signal is adapted to either a full-bridge class-D amplifier or a half-bridge class-D amplifier.

The class-D amplifier proposed by the present invention analyzes the amplitude of the input signal for controlling the voltage provided by the power supply to the class-D amplifier. Hence, the output signals are enabled to have a number of level variations for increasing the resolution of the output signal.

In order to make the aforementioned and other objects, features and advantages of the present invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
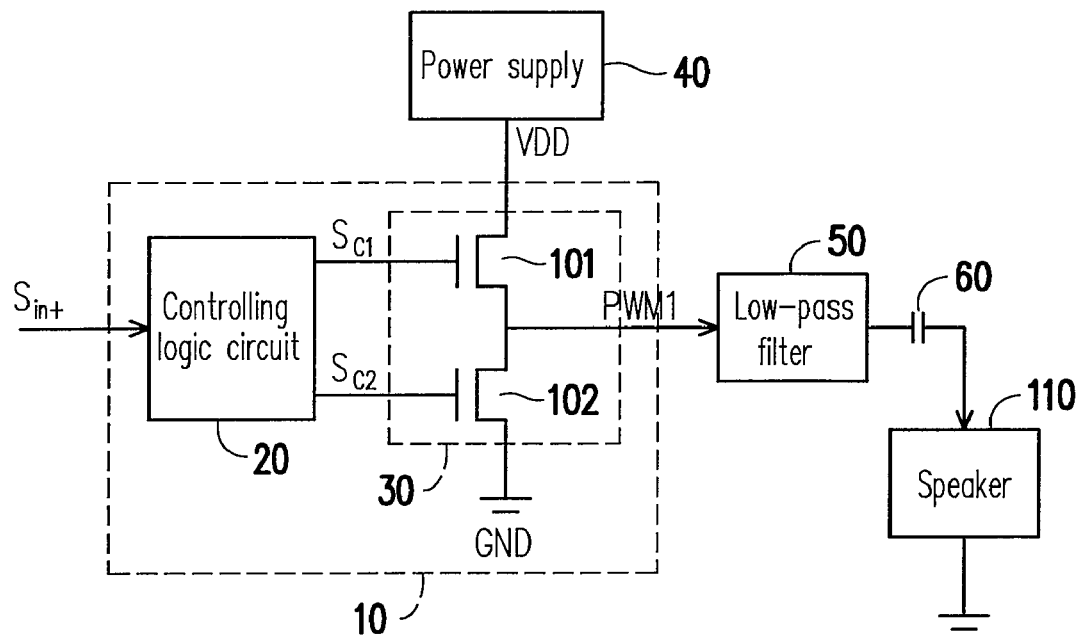
FIG. 1 is a schematic view illustrating a conventional half-bridge class-D amplifier.
Figure 2:
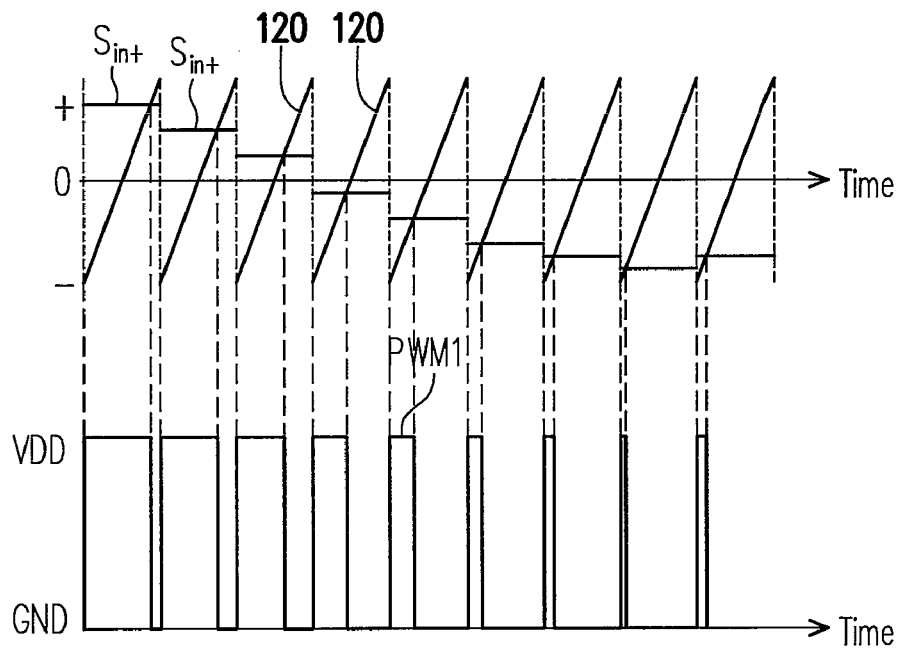
FIG. 2 is a schematic view illustrating a waveform of a PWM signal generated by the class-D amplifier depicted in FIG. 1.
Figure 3:
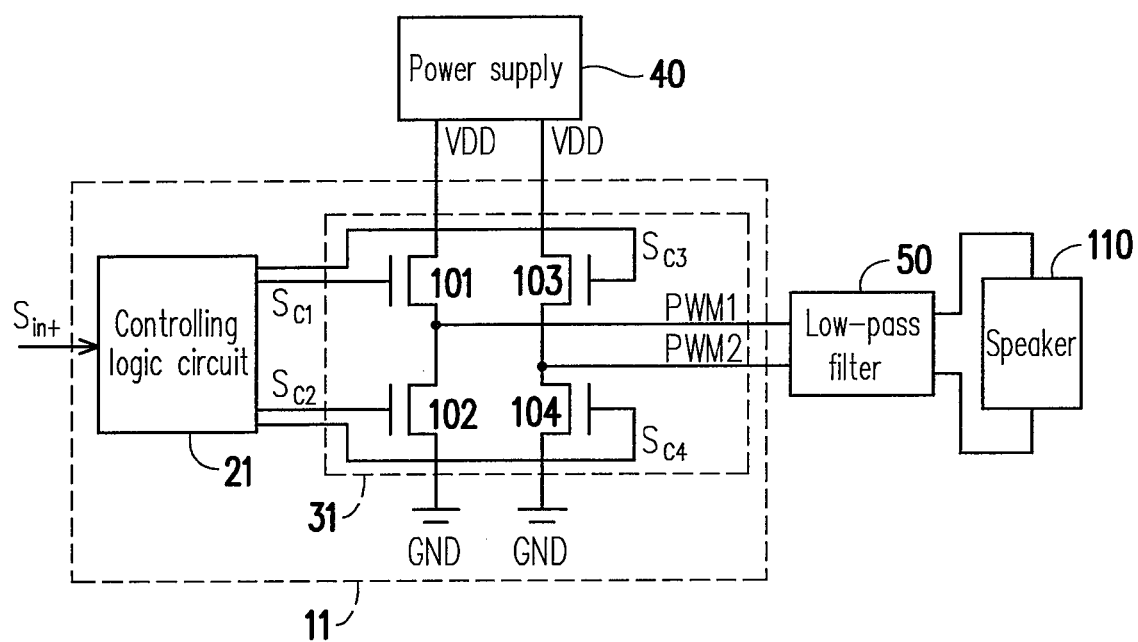
FIG. 3 is a schematic view illustrating a conventional full-bridge class-D amplifier.
Figure 4:
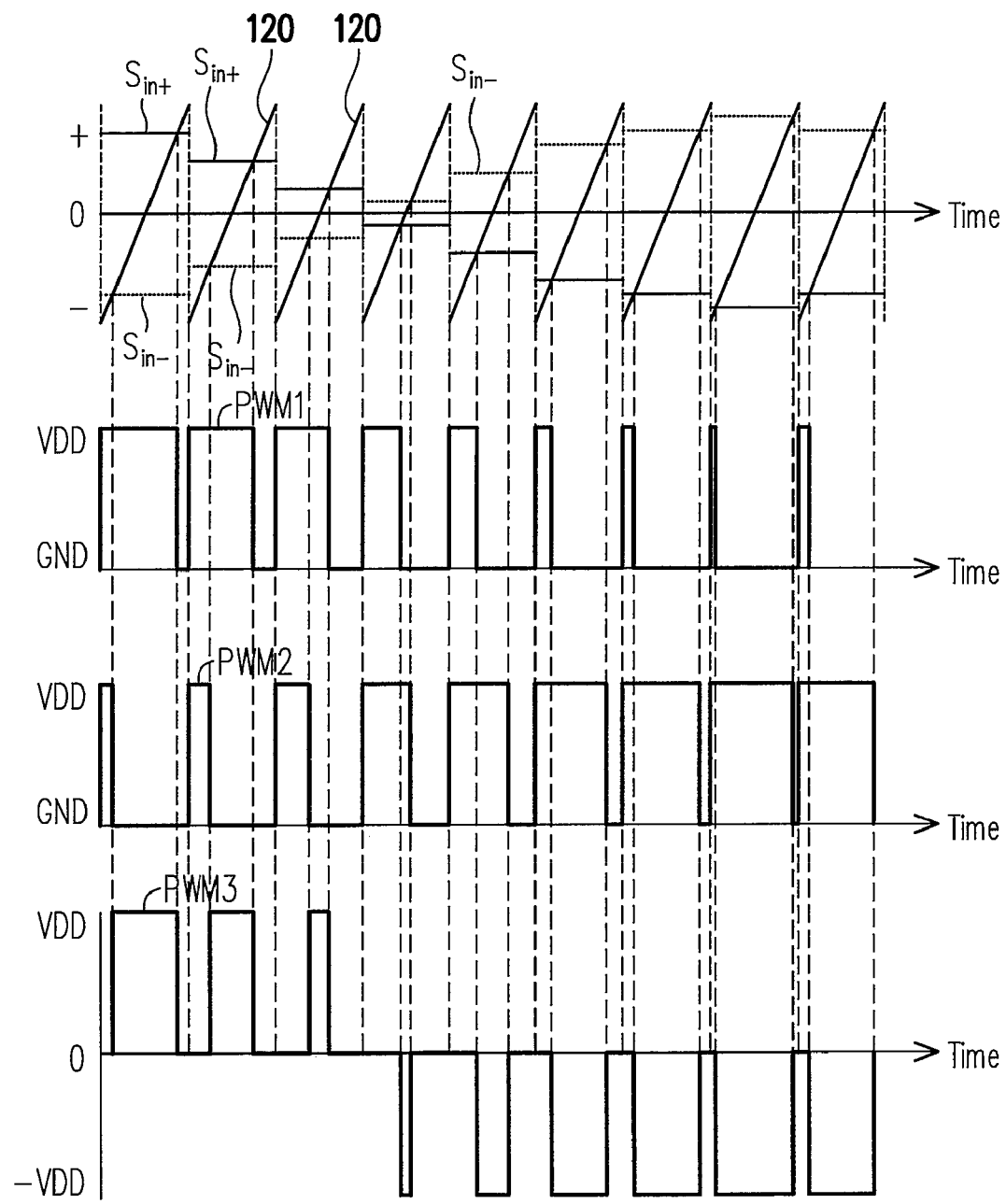
FIG. 4 is a schematic view illustrating a waveform of the PWM signal generated by the class-D amplifier depicted in FIG. 3.

As indicated in FIG. 1, the power supply 40 is merely capable of providing the constant voltage VDD to the conventional half-bridge class-D amplifier 10, and thus the class-D amplifier 10 can only provide the two-level PWM signal PWM1. Besides, as shown in FIG. 3, the power supply 40 is merely capable of providing the constant voltage VDD to the conventional full-bridge class-D amplifier 11 as well, and thus the class-D amplifier 11 can only provide the PWM signal PWM3 with three levels or less.

In light of the foregoing, a class-D amplifier discussed in the embodiment of the present invention analyzes the amplitude of an input signal for controlling a voltage provided by a power supply to the class-D amplifier. Hence, the output signal of the class-D amplifier is enabled to have a number of level variations for increasing the resolution of the output signal. A half-bridge class-D amplifier is taken for example to elaborate the present invention as follows.

First Embodiment

Figure 5:
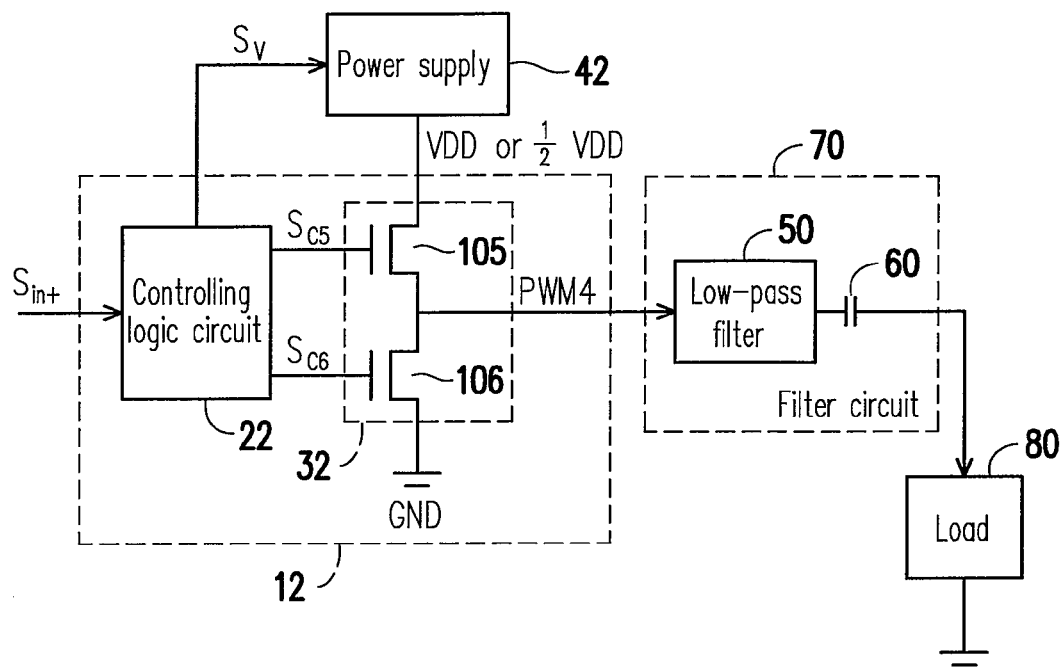
FIG. 5 is a schematic view illustrating a half-bridge class-D amplifier according to a first embodiment of the present invention.

FIG. 5 is a schematic view illustrating a half-bridge class-D amplifier according to a first embodiment of the present invention. Referring to FIG. 5, a class-D amplifier 12 includes a controlling logic circuit 22 and an output module 32. The controlling logic circuit 22 is coupled to a power supply 42. The output module 32 is coupled to the controlling logic circuit 22 and the power supply 42. The controlling logic circuit 22 analyzes the amplitude of an input signal $S_{in+}$ for generating a voltage modifying signal $S_v$. Here, the input signal $S_{in+}$ is, for example, an audio signal. Besides, the controlling logic circuit 22 is able to generate controlling signals $S_{c5}$ and $S_{c6}$ based on the input signal $S_{in+}$ for determining whether switches 105 and 106 are turned on. In the present embodiment, the switches 105 and 106 are, for example, transistors.

Based on the above, the power supply 42 provides various voltages based on the voltage modifying signal $S_v$. Specifically, the power supply 42 of the present embodiment provides a voltage VDD or a voltage ½ VDD. The output module 32 can generate the output signal based on the controlling signals $S_{c5}$ and $S_{c6}$ and the voltage supplied by the power supply 42. In the present embodiment, the output signal is, for example, a PWM signal PWM4.

High-band noises may occur when the output module 32 performs a switching operation. However, after the PWM signal PWM4 is processed by a low-pass filter 50 of a filter circuit 70, the high-band noises of the PWM signal PWM4 can be filtered out. Thereafter, a DC filter capacitor 60 is adopted for filtering out DC noises of the PWM signal PWM4, and thereby a load 80 is driven. In the present embodiment, the load 80 is a speaker (or an amplifier), for example, which is not limited herein. According to other embodiments, the load 80 can also be an earphone or any other audio signal output apparatuses. Further discussion with respect to the controlling logic circuit 22 is provided below.

Figure 6:
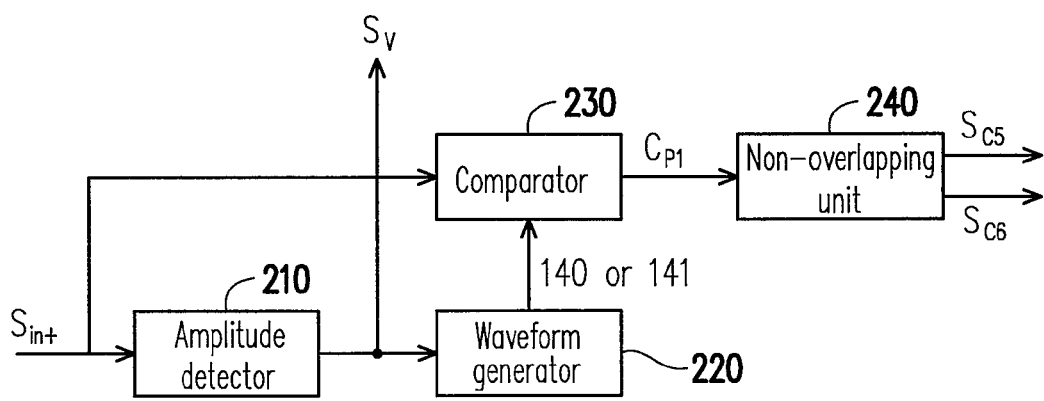
FIG. 6 is a schematic view illustrating a controlling logic circuit according to the first embodiment of the present invention.

FIG. 6 is a schematic view illustrating a controlling logic circuit according to the first embodiment of the present invention. Referring to FIGS. 5 and 6, the controlling logic circuit 22 includes an amplitude detector 210, a waveform generator 220, a comparator 230, and a non-overlapping unit 240. The amplitude detector 210 analyzes the amplitude of the input signal $S_{in+}$. The waveform generator 220 coupled to the amplitude detector 210 provides different reference waveforms based on the amplitude of the input signal $S_{in+}$. For example, the reference waveform in the present embodiment is a triangular waveform 140 or 141. The comparator 230 coupled to the amplitude detector 210 and the waveform generator 220 provides a comparison signal $C_{p1}$ by comparing the input signal $S_{in+}$ with the reference waveform generated by the waveform generator 220. The non-overlapping unit 240 coupled to the comparator 230 generates the controlling signals $S_{c5}$ and $S_{c6}$ based on the comparison signal $C_{p1}$, so as to determine whether the switches 105 and 106 are turned on or turned off and to thereby generate the PWM signal PWM4.

Figure 7:
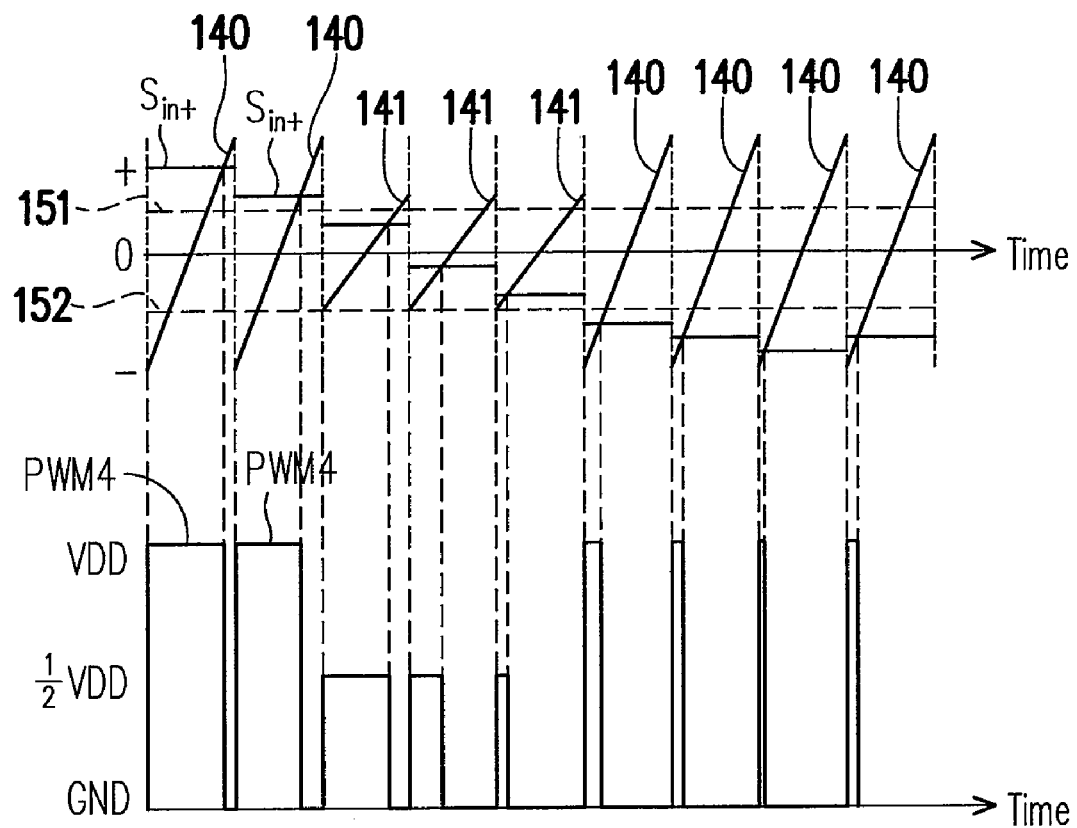
FIG. 7 is a schematic view illustrating a waveform of a PWM signal generated by the class-D amplifier depicted in FIG. 5.
Figure 8:
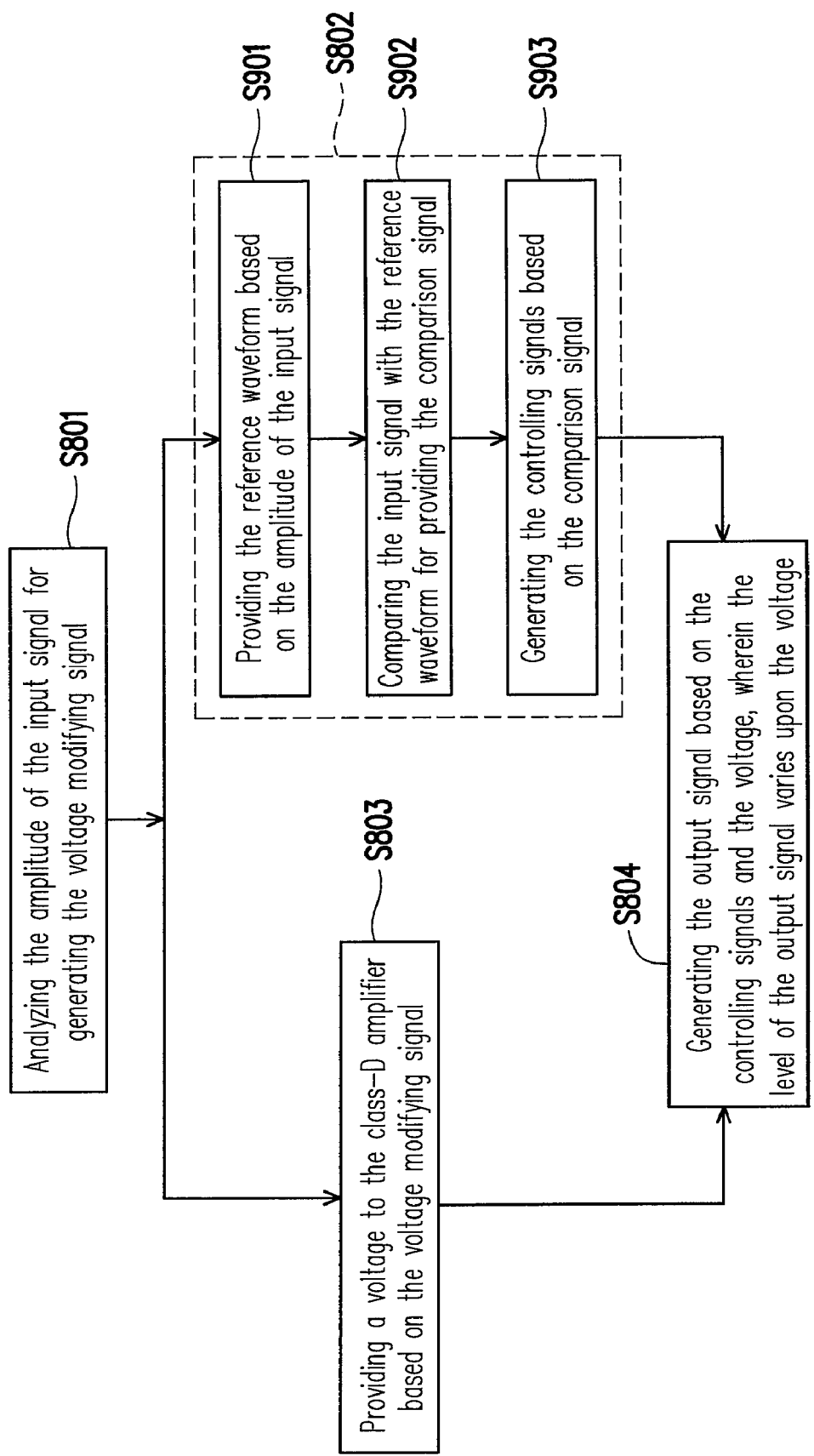
FIG. 8 is a flowchart illustrating a method of generating a multi-level output signal according to the first embodiment of the present invention.

FIG. 7 is a schematic view illustrating a waveform of the PWM signal generated by the class-D amplifier depicted in FIG. 5. FIG. 8 is a flowchart illustrating a method of generating a multi-level input signal according to the first embodiment of the present invention. Referring to FIGS. 5~8 together, in step S801, the amplitude detector 210 analyzes the amplitude of the input signal $S_{in+}$ for generating the voltage modifying signal $S_v$. Next, steps S802 and S803 are performed. The step S802 is discussed first. In the step S802, a plurality of controlling signals is generated based on the input signal $S_{in+}$. According to the present embodiment, the step S802 is explained by taking steps S901~S903 as examples. Here, the steps S901~S903 are expounded in detail.

The waveform generator 220 provides different reference waveforms based on the amplitude of the input signal $S_{in+}$ the step S901. In particular, the information with respect to the amplitude of the input signal $S_{in+}$ is contained in the voltage modifying signal $S_v$. Hence, the different reference waveforms are provided by the waveform generator 220 in accordance with the voltage modifying signal $S_v$. As depicted in FIG. 7, two threshold values 151 and 152 are configured in the present embodiment. As the amplitude of the input signal $S_{in+}$ ranges between the threshold values 151 and 152, the waveform generator 220 provides the triangular waveform 141 to the comparator 230. By contrast, the amplitude of the input signal $S_{in+}$ falls out of the range between the threshold values 151 and 152, the waveform generator 220 provides the triangular waveform 140 to the comparator 230.

Next, in the step S902, the comparator 230 compares the input signal $S_{in+}$ with the reference waveform provided by the waveform generator 220, so as to furnish the comparison signal $C_{p1}$ to the non-overlapping unit 240. Thereafter, in the step S903, the non-overlapping unit 240 generates the controlling signals $S_{c5}$ and $S_{c6}$ based on the comparison signal $C_{p1}$ for determining whether the switches 105 and 106 are turned on or off. As such, it is unlikely for the switches 105 and 106 to be simultaneously turned on, thus avoiding circuits from being damaged and reducing power consumption.

Specifically, as the amplitude of the input signal $S_{in+}$ is greater than the amplitude of the reference waveform, the comparison signal $C_{p1}$ set at a high voltage level is provided by the comparator 230. Here, the switch 105 is determined to be turned on upon the controlling signal $S_{c5}$, while the switch 106 is determined to be turned off upon the controlling signal $S_{c6}$. On the contrary, as the amplitude of the input signal $S_{in+}$ is less than the amplitude of the reference waveform, the comparison signal $C_{p1}$ set at a low voltage level is provided by the comparator 230. Here, the switch 105 is determined to be turned off upon the controlling signal $S_{c5}$, while the switch 106 is determined to be turned on upon the controlling signal $S_{c6}$.

On the other hand, in the step S803, the power supply 42 can also provide different voltages to the output module 32 based on the voltage modifying signal $S_v$ obtained by performing the step S801. In detail, as the amplitude of the input signal $S_{in+}$ ranges between the threshold values 151 and 152, the power supply 42 provides the voltage ½ VDD to the output module 32. By contrast, as the amplitude of the input signal $S_{in+}$ falls out of the range between the threshold values 151 and 152, the power supply 42 provides the voltage VDD to the output module 32. As such, the output module 32 can generate the multi-level PWM signal PWM4 based on the controlling signals $S_{c5}$ and $S_{c6}$ and the voltage supplied by the power supply 42 (the step S804).

In comparison with the conventional class-D amplifier 10 illustrated in FIG. 1, the class-D amplifier 12 depicted in FIG. 5 according to the present embodiment is able to generate the three-level PWM signal PWM4. Nevertheless, the conventional class-D amplifier 10 illustrated in FIG. 1 can merely provide the two-level PWM signal PWM1. Moreover, when the amplitude of the input signal $S_{in+}$ is decreased in the step S901, it is desired to synchronically reduce the amplitude of the reference waveform, for a noise floor is also lowered in an effective manner. In addition, the resolution of the PWM signal PWM4 on a time axis is able to be maintained. Since the resolution of the PWM signal PWM4 of the present embodiment is greater than the resolution of the conventional PWM signal PWM1, an SNR of the class-D amplifier 12 of the present embodiment is higher than the SNR of the conventional class-D amplifier 10.

It should be noted that the class-D amplifier and the method of generating the multi-level output signal have been generally narrated in the above embodiment, whilst people skilled in the pertinent art should be aware that different manufacturers aim at designing distinctive class-D amplifiers and employing different methods of generating the multi-level output signal. Hence, the application of the present invention should not be limited to the embodiment provided hereinbefore. That is to say, as long as the voltages provided to the output module are determined by analyzing the amplitude of the input signal according to the present invention, the scope or spirit of the invention is not deviated. Some other embodiments are further discussed hereinafter to allow people skilled in the art to recognize and embody the present invention.

Referring to FIGS. 5 and 7, in the first embodiment, people skilled in the art are able to define various ranges of the amplitudes by identifying various threshold values, despite the fact that only two threshold values 151 and 152 are defined in FIG. 7. The power supply 42 then provides a corresponding voltage to the output module 32 based on the amplitude range within which the amplitude of the input signal $S_{in+}$ falls. Thereby, the PWM signal PWM4 can be provided with more levels.

Moreover, according to the first embodiment, the power supply 42 alternatively provides the voltage VDD and the voltage ½ VDD which are not limited in the present invention. For instance, as the amplitude of the input signal $S_{in+}$ falls within a first range, the power supply 42 provides a first voltage, e.g. the voltage VDD, to the output module 32. When the amplitude of the input signal $S_{in+}$ falls within a second range, the power supply 42 provides a second voltage, e.g. a voltage ⅓ VDD, to the output module 32. When the amplitude of the input signal $S_{in+}$ falls within a third range, the power supply 42 provides a third voltage, e.g. a voltage ⅔ VDD, to the output module 32. As induced from the above, people skilled in the art are able to change the voltage provided by the power supply 42 based on actual demands.

Referring to FIG. 5, in spite of the fact that the filter circuit 70 is disposed outside the class-D amplifier 12 according to the first embodiment, people skilled in the pertinent art can still integrate the filter circuit 70 into the class-D amplifier 12 for reducing the size of the entire circuits. Several embodiments are further provided hereinafter for references.

Second Embodiment

Figure 9:
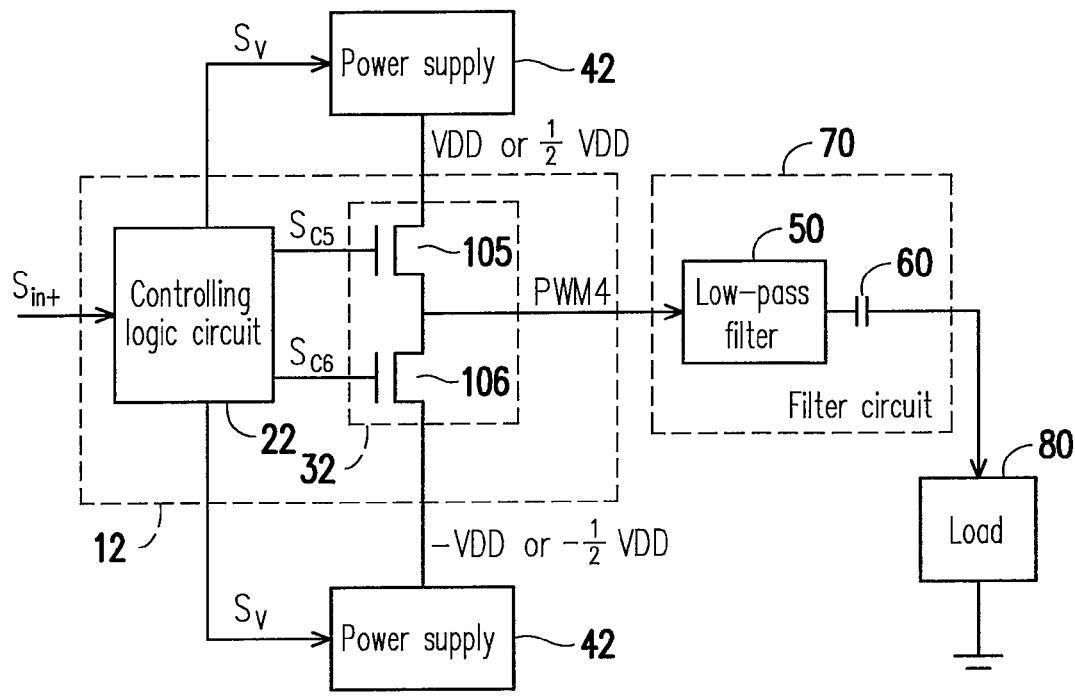
FIG. 9 is a schematic view illustrating a half-bridge class-D amplifier according to a second embodiment of the present invention.

The output module 32 depicted in FIG. 5 is coupled between the ground terminal GND and the voltage provided by the power supply 42, while people skilled in the pertinent art are also capable of coupling the respective ends of the output module 32 to the power supply 42. Namely, the power supply 42 controls the voltages at the respective ends of the output module 32. FIG. 9 is a schematic view illustrating a half-bridge class-D amplifier according to a second embodiment of the present invention. Referring to FIGS. 5 and 9, the second embodiment is similar to the first embodiment. The same reference numerals used throughout FIG. 5 indicate the same or similar elements described in the first embodiment, and thus further elaboration is omitted herein.

Note that the power supply 42 is able to provide a first end of the output module 32 with different voltages, e.g. the voltage VDD or the voltage ½ VDD, based on the voltage modifying signal $S_v$. Moreover, based on the voltage modifying signal $S_v$, the power supply 42 is also capable of providing a second end of the output module 32 with other voltages, such as a voltage −VDD or a voltage −½ VDD. Thereby, not only the voltage level of the PWM signal PWM4 is modified in a flexible manner, but also the DC filter capacitor 60 illustrated in FIG. 5 is omitted for reducing the costs spent on the circuits.

Third Embodiment

Figure 10:
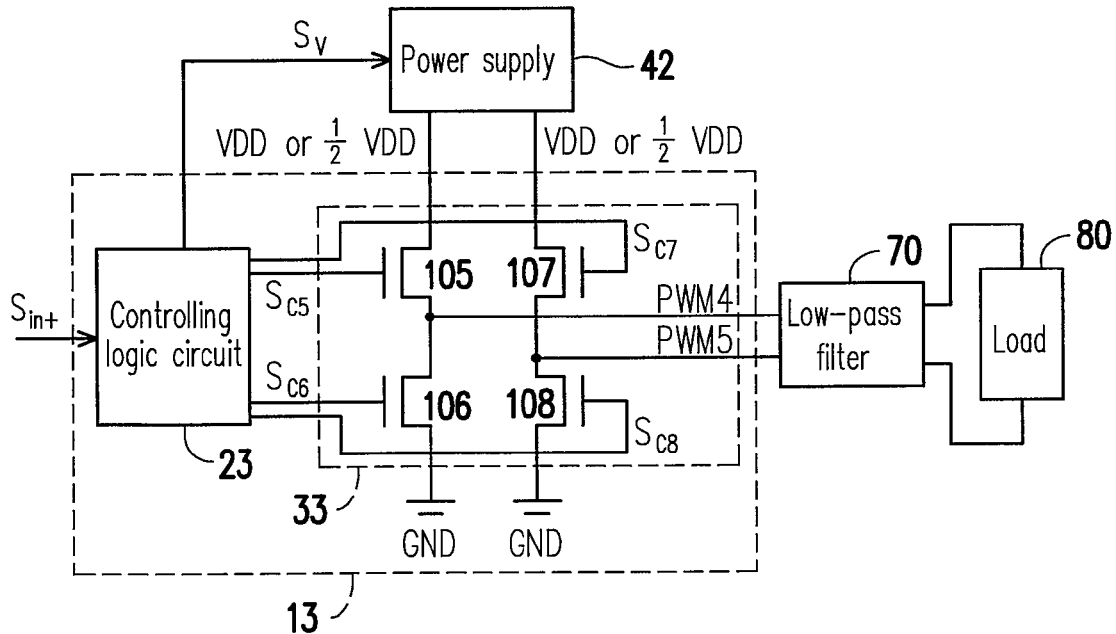
FIG. 10 is a schematic view illustrating a full-bridge class-D amplifier according to a third embodiment of the present invention.
Figure 11:
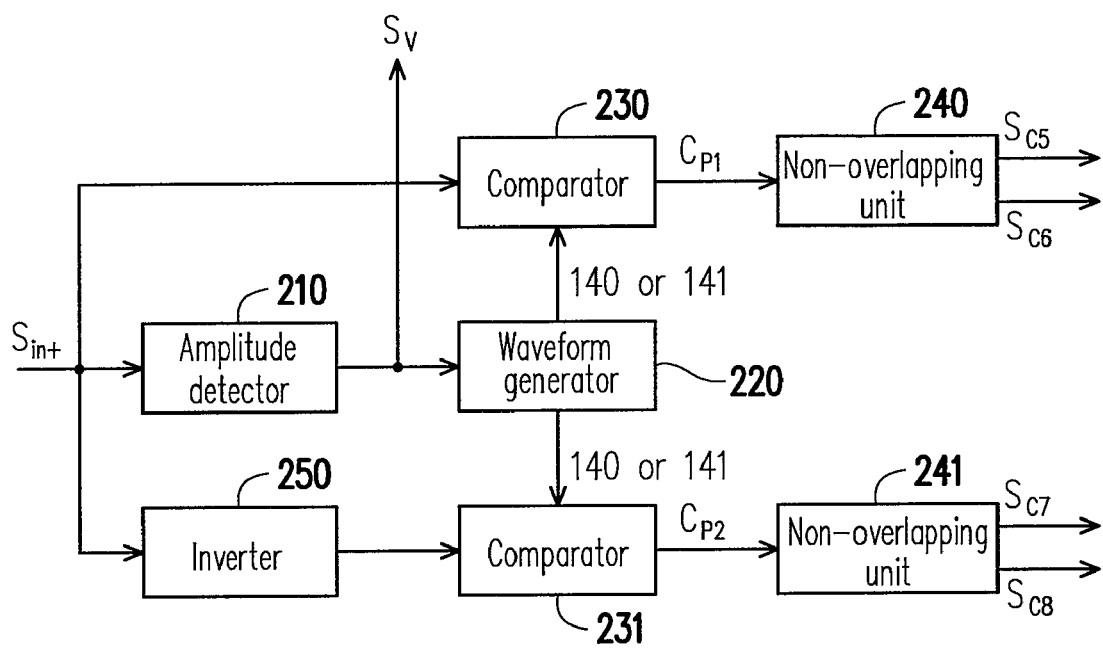
FIG. 11 is a schematic view illustrating a controlling logic circuit according to the third embodiment of the present invention.
Figure 12:
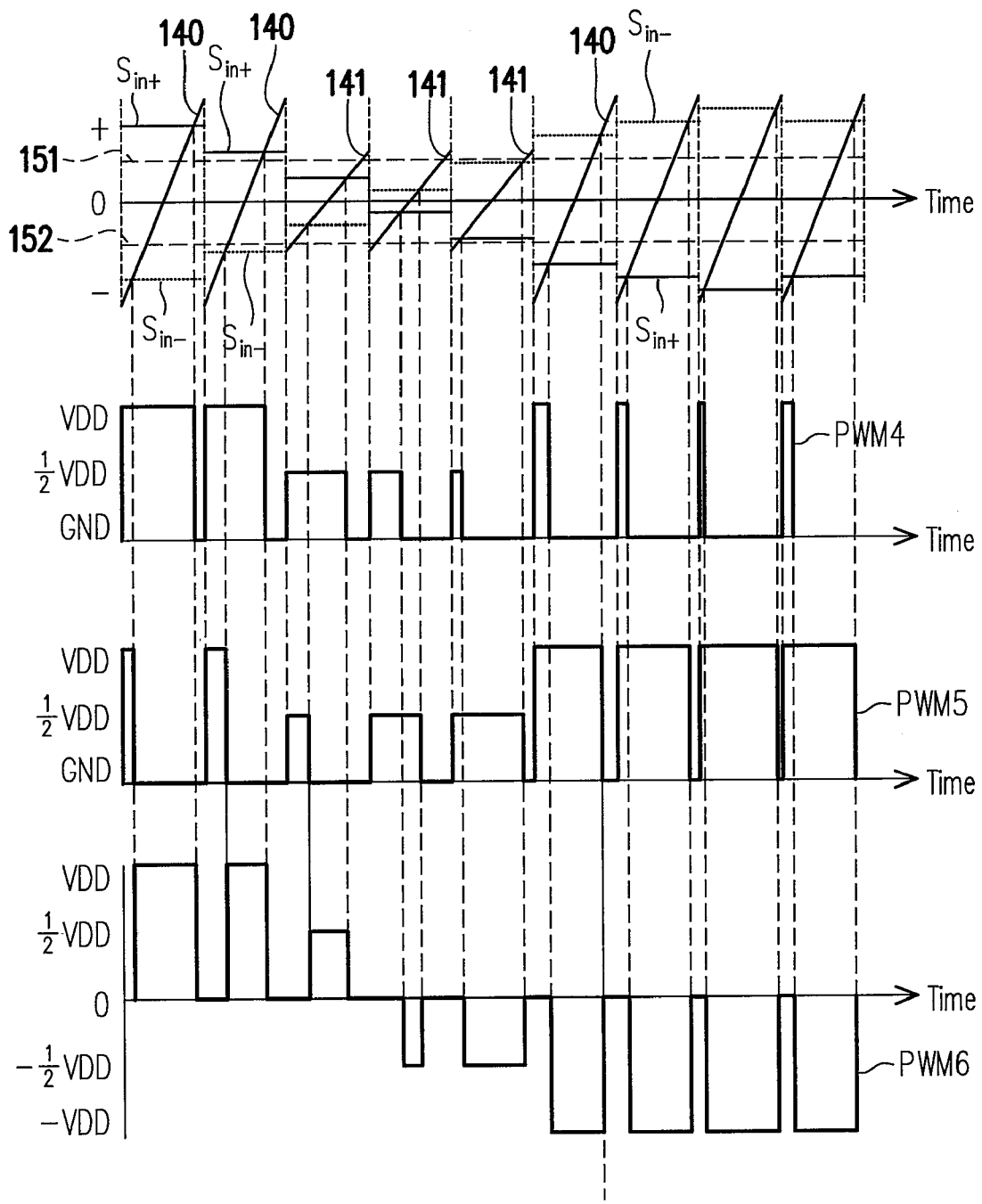
FIG. 12 is a schematic view illustrating a waveform of a PWM signal generated by the class-D amplifier depicted in FIG. 10.

FIG. 10 is a schematic view illustrating a full-bridge class-D amplifier according to a third embodiment of the present invention. FIG. 11 is a schematic view illustrating a controlling logic circuit according to the third embodiment of the present invention. FIG. 12 is a schematic view illustrating a waveform of a PWM signal generated by the class-D amplifier depicted in FIG. 10. The third embodiment resembles the first embodiment. The same reference numerals used throughout FIGS. 10~13 indicate the same or similar elements illustrated in the other drawings provided hereinbefore, and thus further elaboration is omitted herein. Note that a controlling logic circuit 23 of a full-bridge class-D amplifier 13 includes the amplitude detector 210, the waveform generator 220, the comparators 230 and 231, the non-overlapping units 240 and 241, and an inverter 250. In addition, an output module 33 of the class-D amplifier 13 includes the switches 105~108.

The class-D amplifier 13 is not only able to generate the PWM signal PWM4 in the manner indicated in the first embodiment, but also capable of generating another PWM signal PWM5 with use of the controlling logic circuit 23 and switches 107 and 108, which is elaborated below.

A 180-degree phase shifting of the input signal $S_{in+}$ is firstly carried out by the inverter 250, so as to generate the input signal $S_{in-}$. Next, the input signal $S_{in-}$ is compared with the triangular waveform 140 or 141 generated by the waveform generator 220 for obtaining a comparison signal $C_{p2}$. After that, the non-overlapping unit 241 generates controlling signals $S_{c7}$ and $S_{c8}$ based on the comparison signal $C_{p2}$, so as to determine whether the switches 107 and 108 are turned on or turned off and to thereby generate the PWM signal PWM5.

Note that the power supply 42 provides different voltages to the output module 33 in accordance with the varied amplitude of the input signal $S_{in+}$. Accordingly, the PWM signal PWM5 of the present embodiment has three levels, i.e. the voltage VDD, the voltage ½ VDD, and the ground voltage GND.

The PWM signals PWM4 and PWM5 respectively connect two ends of the load 80, and thus a signal received by the load 80 is considered as a PWM signal PWM6 calculated by subtracting the PWM signals PWM4 and PWM5. Thereby, the PWM signal PWM6 generated by the class-D amplifier 13 has five levels, i.e. the voltages VDD, +½ VDD, 0, −½ VDD, and −VDD. However, the PWM signal PWM3 generated by the conventional full-bridge class-D amplifier 11 merely has three levels, i.e. the voltages +VDD, 0, and −VDD. As a result, the SNR of the class-D amplifier 13 of the present embodiment is higher than the SNR of the conventional class-D amplifier 11 depicted in FIG. 3.

To sum up, in the class-D amplifier proposed by the present invention, the amplitude of the input signal is analyzed for controlling the voltage provided by the power supply to the class-D amplifier. Hence, the output signal of the class-D amplifier has various levels, and thereby the SNR of the class-D amplifier can be increased. Moreover, the present invention discussed in the embodiments thereof has at least the following advantages:

1. The power supply is able to determine the voltages received by the respective ends of the output circuit based on the amplitude of the input signal. Accordingly, not only the level of the output signal is adjusted in a flexible manner, but also the cost barrier of manufacturing the DC filter capacitor is removed.

2. The waveform generator is capable of simultaneously adjusting the amplitude of the reference waveform in accordance with the amplitude of the input signal. Thereby, the noise floor can be significantly reduced, and the resolution of the PWM signal on the time axis is maintained.

3. The high-band noises occurring during the switching operation can be removed by employing the low-pass filter.

4. The use of the DC filter capacitor is conducive to the removal of the DC noises.

5. The integration of the filter circuit into the class-D amplifier contributes to a further reduction of the size of the circuits.

It will be apparent to those skilled in the art that various modifications and variations can be made to the structure of the present invention without departing from the scope or spirit of the invention. In view of the foregoing, it is intended that the present invention cover modifications and variations of this invention provided that they fall within the scope of the following claims and their equivalents.

What is claimed is:

1. A class-D amplifier coupled to a power supply, the class-D amplifier comprising:
    a controlling logic circuit, coupled to the power supply, the controlling logic circuit generating a voltage modifying signal by analyzing the amplitude of a first input signal and generating a plurality of controlling signals based on the first input signal, wherein the power supply provides a first voltage based on the voltage modifying signal; and
    an output module, coupled to the controlling logic circuit and the power supply, the output module generating an output signal based on the controlling signals and the first voltage so as to drive a load.

2. The class-D amplifier as claimed in claim 1, wherein the controlling logic circuit comprises:
    an amplitude detector, for analyzing the amplitude of the first input signal;
    a waveform generator, coupled to the amplitude detector and providing a reference waveform based on the amplitude of the first input signal;
    a comparator, coupled to the amplitude detector and the waveform generator, the comparator providing a first comparison signal by comparing the first input signal and the reference waveform; and
    a non-overlapping unit, coupled to the comparator and generating a first controlling signal and a second controlling signal of the controlling signals based on the first comparison signal.

3. The class-D amplifier as claimed in claim 2, wherein the controlling logic circuit further comprises:
    an inverter, generating a second input signal based on the first input signal;
    a second comparator, coupled to the inverter and the waveform generator, the second comparator providing a second comparison signal by comparing the second input signal and a second reference waveform provided by the waveform generator; and
    a second non-overlapping unit, coupled to the second comparator and generating a third controlling signal and a fourth controlling signal of the controlling signals based on the second comparison signal.

4. The class-D amplifier as claimed in claim 1, wherein the reference waveform is a triangular waveform.

5. The class-D amplifier as claimed in claim 1, wherein the output module comprises:
    a first transistor, wherein a first end of the first transistor and a gate terminal of the first transistor respectively receive a first voltage and a first controlling signal of the controlling signals; and
    a second transistor, wherein a first end of the second transistor is coupled to a second end of the first transistor, and a second end of the second transistor and a gate terminal of the second transistor respectively receive a second voltage and a second controlling signal of the controlling signals.

6. The class-D amplifier as claimed in claim 5, wherein the output module further comprises:
    a third transistor, wherein a first end of the third transistor and a gate terminal of the third transistor respectively receive the first voltage and a third controlling signal of the controlling signals; and
    a fourth transistor, wherein a first end of the fourth transistor is coupled to a second end of the third transistor, and a second end of the fourth transistor and a gate terminal of the fourth transistor respectively receive the second voltage and a fourth controlling signal of the controlling signals.

7. The class-D amplifier as claimed in claim 5, further comprising:
    a filter circuit, coupled to the output module for filtering out noises of the output signal.

8. The class-D amplifier as claimed in claim 7, wherein the filter circuit comprises:
    a filter, coupled to the output module for filtering out high-band noises of the output signal.

9. The class-D amplifier as claimed in claim 7, wherein the filter circuit comprises:
    a direct current (DC) filter capacitor, coupled to the output module for filtering out DC noises of the output signal.

10. The class-D amplifier as claimed in claim 5, wherein the second voltage is provided by the power supply based on the amplitude of the input signal.

11. The class-D amplifier as claimed in claim 1, wherein the load is a speaker, an earphone, or an audio signal output apparatus.

12. A method of generating a multi-level output signal, the method being adapted to a class-D amplifier and comprising:
    analyzing the amplitude of an input signal for generating a voltage modifying signal;
    generating a plurality of controlling signals based on the input signal;
    providing a voltage to the class-D amplifier based on the voltage modifying signal; and generating an output signal based on the controlling signals and the voltage, wherein the level of the output signal varies upon the voltage.

13. The method of generating the multi-level output signal as claimed in claim 12, wherein the step of generating a plurality of the controlling signals based on the input signal comprises:
providing a reference waveform based on the amplitude of the input signal;
providing a comparison signal by comparing the input signal with the reference waveform; and
generating the controlling signals based on the comparison signal.

14. The method of generating the multi-level output signal as claimed in claim 13, wherein the reference waveform is a triangular waveform.

15. The method of generating the multi-level output signal as claimed in claim 12, the method being adapted to a full-bridge class-D amplifier or a half-bridge class-D amplifier.

* * * * *